United States Patent
Suzuki et al.

(10) Patent No.: US 7,935,430 B2
(45) Date of Patent: May 3, 2011

(54) BONDING STRUCTURE OF SUBSTRATE AND COMPONENT AND METHOD OF MANUFACTURING THE SAME

(75) Inventors: Hiroki Suzuki, Fukushima-ken (JP); Masato Uehara, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 461 days.

(21) Appl. No.: 11/553,387

(22) Filed: Oct. 26, 2006

(65) Prior Publication Data
US 2007/0102487 A1   May 10, 2007

(30) Foreign Application Priority Data
Oct. 31, 2005   (JP) .................... 2005-315931

(51) Int. Cl.
B32B 15/08 (2006.01)
B32B 15/16 (2006.01)
B23K 1/00 (2006.01)
B23K 1/19 (2006.01)
B22F 7/02 (2006.01)
H01L 23/14 (2006.01)

(52) U.S. Cl. ........ 428/550; 428/551; 428/613; 428/620; 428/626; 228/262.9; 228/123.1; 228/179.1; 228/189

(58) Field of Classification Search .................... None
See application file for complete search history.

(56) References Cited

U.S. PATENT DOCUMENTS

| | | | | |
|---|---|---|---|---|
| 5,463,190 A * | 10/1995 | Carson et al. | | 174/259 |
| 6,342,732 B1* | 1/2002 | Ochiai et al. | | 257/734 |
| 7,268,417 B2* | 9/2007 | Ochi et al. | | 257/679 |
| 2003/0147200 A1* | 8/2003 | Harada et al. | | 361/321.4 |
| 2003/0201427 A1* | 10/2003 | Hori et al. | | 252/500 |
| 2004/0154658 A1* | 8/2004 | Tanaka et al. | | 136/256 |
| 2005/0029666 A1* | 2/2005 | Kurihara et al. | | 257/772 |
| 2005/0093164 A1* | 5/2005 | Standing | | 257/772 |
| 2006/0226398 A1* | 10/2006 | Hori et al. | | 252/500 |
| 2007/0185243 A1* | 8/2007 | Terada et al. | | 523/457 |
| 2007/0235844 A1* | 10/2007 | Suzuki | | 257/668 |
| 2007/0257362 A1* | 11/2007 | Karashima et al. | | 257/737 |
| 2007/0278456 A1* | 12/2007 | Sakai et al. | | 252/512 |

FOREIGN PATENT DOCUMENTS

| | | |
|---|---|---|
| JP | 06-295616 | 10/1994 |
| JP | 09-194768 | 7/1997 |
| JP | 2004-362950 | 12/2004 |

OTHER PUBLICATIONS

JP 2004-362950 English Machine Translation, Atsushi, Dec. 2004.*
JP 2001-135924 English Machine Translation, Hiroshi, Nov. 1999.*

* cited by examiner

*Primary Examiner* — Jennifer C McNeil
*Assistant Examiner* — Jason L Savage
(74) *Attorney, Agent, or Firm* — Brinks Hofer Gilson & Lione

(57) ABSTRACT

A bonding structure and method of manufacturing the same are provided. The bonding structure of a substrate and a component include an electrode formed of metal powder and a resin component on the substrate. A low melting point solder that bonds the component to the electrode. The metal powder contains at least spherical metal powder and flake metal powder. The low melting point solder is infiltrated from the surface of the electrode into the electrode.

9 Claims, 6 Drawing Sheets

BONDING STRUCTURE OF SUBSTRATE AND COMPONENT AND METHOD OF MANUFACTURING THE SAME

This patent document claims the benefit of Japanese Patent Application No. 2005-315931 filed on Oct. 31, 2005, which is hereby incorporated by reference.

BACKGROUND

1. Field

The present embodiments relate to a bonding structure of a substrate and a component and to a method of manufacturing the same.

2. Related Art

In the related art, when an electronic component and an electrode formed on a substrate are bonded to each other by using solder, for example, Sn—Ag—Cu has been used as the solder. However, since Sn—Ag—Cu has a high soldering temperature (equal to or higher than 200° C.), an electronic component having a low degree of heat tolerance is easily damaged. When a substrate formed of PET (polyethylene terephthalate) is used, the substrate is melted at the soldering temperature.

Further, when a coating-film-shaped electrode formed by screen-printing and heating a conductive paste containing metal powder and resin is used, the solder wettability of the electrode is deteriorated, and the resin component of the electrode is thermally decomposed at the soldering temperature.

As described above, when a high-melting-point solder is used, various problems arise. For this reason, it is preferable to use a low melting point solder rather than a high-melting-point solder. However, for example, when an electrode composed of a copper film is used, good environment resistance cannot be obtained. The resistance of the electrode increases due to corrosion. Even when a very small electrode pattern is formed in accordance with a reduction in the size of an electronic component, it is difficult to form a very small electrode pattern with the copper film. Even when it is wanted to use, as the electrode, the conductive coating film formed by screen-printing and heating the conductive paste containing metal powder and resin, the solder wettability of the conductive coating film is low, as described above.

Even when the solder wettability is high, it is required to appropriately reduce the electric resistance between the solder and the electrode.

For example, in JP-A-6-295616, the primary object is to improve the solder wettability of the conductive coating film. However, JP-A-6-295616 does not disclose a technique for improving the solder wettability by using a low melting point solder. JP-A-6-295616 discloses an experiment for testing the solder wettability, but does not clearly disclose which solder is used. In addition, JP-A-6-295616 does not disclose a structure for appropriately reducing the electric resistance between the solder and the electrode. Both JP-A-2004-362950 and JP-A-9-194768 relate to a conductive past. However, JP-A-2004-362950 and JP-A-9-194768 do not disclose the use of a low melting point solder.

As described above, the conventional techniques fail to disclose how to improve the solder wettability of a conductive coating film containing metal powder and resin when a low melting point solder is used, or how to reduce the electric resistance between the solder and the electrode.

SUMMARY

The present embodiments may obviate one or more of the limitations of the related art. For example, in one embodiment, a bonding structure of a substrate and an electronic component is provided that is capable of appropriately improving the solder wettability of a conductive coating film formed of metal powder and resin when a low melting point solder is used.

In one embodiment, a bonding structure of a substrate and a component includes an electrode formed of metal powder and a resin component on the substrate; and a low melting point solder bonding the component to the electrode. In the bonding structure, the metal powder contains at least spherical metal powder and flake metal powder, and the low melting point solder penetrates from the surface of the electrode into the electrode.

According to this embodiment, since the electrode contains the flake metal powder and the spherical metal powder, the low melting point solder can appropriately penetrate into the electrode. It is considered that the low melting point solder penetrates into the electrode sliding down the flake metal powder. However, when the low melting point solder excessively penetrates into the electrode, problems, for example, the breaking of the wire, occur due to solder erosion. The spherical metal powder is used to prevent such excessive penetration.

In one embodiment, it is possible to improve the solder wettability of the electrode with respect to the low melting point solder and to maintain good electrical connection between the electrode and the low melting point solder (to reduce the electric resistance). Since the low melting point solder is used, the soldering temperature is low. Therefore, it is possible to prevent the resin component of the electrode or the substrate from being decomposed or melted.

In one embodiment, it is preferable that the component and the substrate except for the electrode be at least partially bonded to each other by resin so as to improve the bonding strength between the substrate and the component. In the bonding structure, it is preferable that the resin be a thermosetting resin.

In another embodiment, it is preferable that the low melting point solder and the thermosetting resin be mixed and applied on at least the electrode as a solder adhesive before heating. Due to the heating, the low melting point solder is aggregated on the electrode and the thermosetting resin seeps into a portion on the substrate except for the electrode. Therefore, it is possible to improve the bonding strength between the substrate and the component with a simple structure.

In one embodiment, it is preferable that the amount of flake metal powder in the metal powder be about 5% to 99.5% by mass in order to maintain good solder wettability and appropriately reduce the electric resistance between the electrode and the low melting point solder.

In one embodiment, it is preferable that the amount of metal powder in the electrode be about 90% to 97.5% by mass in order to appropriately improve the solder wettability of the electrode.

In one embodiment, it is preferable that the average particle diameter of the spherical metal powder be 3 μm or smaller in order to suppress solder erosion.

In one embodiment, it is preferable that the resin component be a thermoplastic resin in order to increase the content of metal powder and to form a structure in which the low melting point solder appropriately penetrates into the electrode. In another embodiment, a curing agent is contained in the electrode in order to improve the bonding strength between the electrode and the substrate and to appropriately maintain the structure in which the low melting point solder penetrates into the electrode. It is preferable that the curing agent be an isocyanate, but is not limited this composition.

Assuming that hydroxyl equivalent of the thermoplastic resin is 1 equivalent, the equivalent of isocyanate may be equal to or less than 2.5 equivalents. When the equivalent of the curing agent is more than 2.5 equivalents, the solder wettability of the electrode is deteriorated.

According to another embodiment, there is provided a method of manufacturing a bonding structure of a substrate and a component. The method includes: forming an electrode with spherical metal powder, flake metal powder, and a resin component on the substrate; applying a solder adhesive containing a low melting point solder and a thermosetting resin between at least the electrode and the component; and performing low-temperature heating such that the low melting point solder is aggregated on the electrode and penetrates from the surface of the electrode into the electrode to bond the electrode to the component by the low melting point solder and the thermosetting resin seeps into at least a portion on the substrate except for the electrode so as to adhere the substrate and the component to each other by the thermosetting resin.

In the method, since the low melting point solder is used, soldering can be performed at a low temperature. Therefore, it is possible to prevent the resin component of the electrode or the substrate from being decomposed or melted due to heat. In the method, since the solder adhesive containing the low melting point solder and the thermosetting resin is used, it is possible to bond the electrode and the component by the low melting point solder, and at the same time to adhere the substrate and the component by the thermosetting resin by one heating process. It is preferable that the heating temperature be set on the basis of the melting point of the solder and a curing temperature and be adjusted to a temperature higher than the melting point of the low melting point solder and the curing temperature of the thermosetting resin. Due to the heating, the low melting point solder is melted and aggregated on the electrode. At that time, the low melting point solder penetrates in a softened state into the electrode sliding down the flake metal powder and at the same time, excessive penetration is prevented by the spherical metal powder. The low melting point solder hardens so as to appropriately solder the electrode and the component together. The thermosetting resin seeps into at least portion on the substrate except for the electrode. The thermosetting resin is thermally cured so as to bond the substrate and the component.

In one embodiment, it is possible to improve the solder wettability of the electrode by a simple and appropriate method. For example, it is possible to obtain good electrical connection between the electrode and the low melting point solder. In one embodiment, it is possible to manufacture the bonding structure of the substrate and the component capable of appropriately improving the bonding strength.

According to one embodiment, it is possible to obtain good solder wettability of the electrode and to maintain good electrical connection (i.e. to reduce the electric resistance) between the electrode and the low melting point solder. Since the low melting point solder is used, it is possible to perform the soldering at a low temperature and thus to prevent the resin component of the electrode or the substrate from being decomposed or melted.

DETAILED DESCRIPTION

Figure 1:
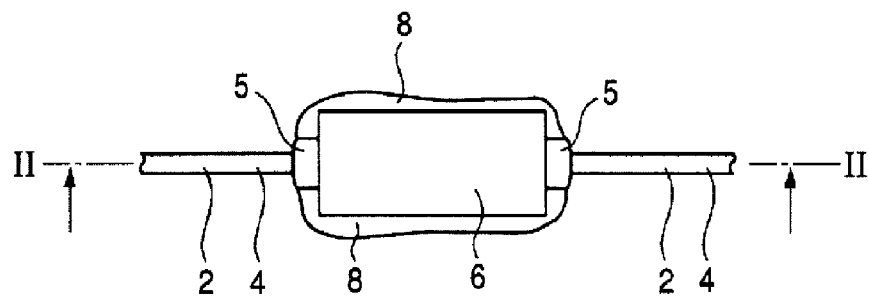
FIG. 1 is a plan view showing an electronic member in which an electronic component is mounted on a substrate according to one embodiment.
Figure 2:
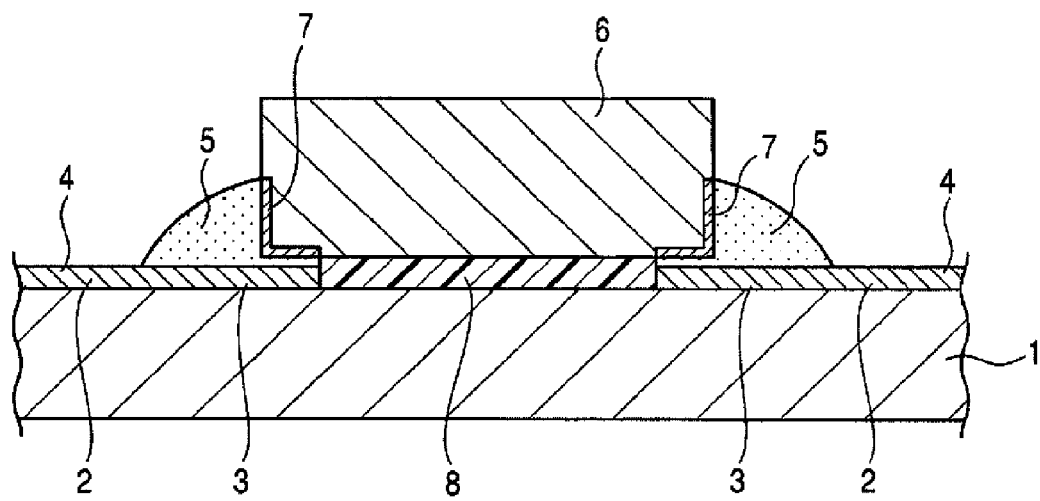
FIG. 2 is a partial cross-sectional view of the electronic member taken along the line II-II of FIG. 1, as viewed in an arrow direction.

FIG. 1 is a plan view showing an electronic member in which electronic components are mounted on a substrate according to one embodiment. FIG. 2 is a partial cross-sectional view of the electronic member taken along the line II-II of FIG. 1, as viewed in an arrow direction.

In FIG. 2, reference numeral 1 denotes a substrate. The substrate 1 is formed of, for example, PET (polyethylene terephthalate) or polyimide, preferably, PET in order to reduce manufacturing costs. PET does not have good heat-resisting property, therefore, PET is melted at a soldering temperature when a high-melting-point solder is used according to the related art. However, in this embodiment, since a low melting point solder is used, the soldering temperature can be lowered, as compared to the related art. Therefore, even when the substrate 1 is formed of PET, it is possible to prevent the substrate 1 from being melted at the soldering temperature. When high transparency is needed, the substrate may be composed of a PEN (polyethylene naphthalene) film. Further, when high fire retardancy is needed, the substrate may be composed of a polyimide film.

As shown in FIG. 1, conductive patterns 2 are formed on the substrate 1, and ends of the conductive patterns 2 form electrodes 3. The conductive patterns 2 may be formed of the same material. Alternatively, the electrodes 3 and conductive portions 4 except for the electrodes 3 may be formed of different materials.

In one embodiment, the electrode 3 has good solder wettability; however, since soldering is not performed on the conductive portion 4, the conductive portion 4 may have poor solder wettability. The conductive portion 4 is preferably formed to have a resistance lower than that of the electrode 3.

The conductive pattern 2 is formed on the substrate 1 by, for example, a screen print method, and thus it is preferable that the print quality of the conductive portion 4 occupying most of the conductive pattern 2 be better than that of at least the electrode 3. For this reason, the resin content of the conductive portion 4 is adjusted to be larger than that of the electrode 3. In one embodiment, it is preferable that the amount of spherical metal power contained in metal power of the conductive portion 4 (% of mass) be larger than the amount of spherical metal power contained in metal power of the electrode 3.

As shown in FIGS. 1 and 2, conductive connectors 7, formed of a conductive material, of an electronic component 6 are soldered on the electrodes 3 through low melting point solder 5s. The low melting point solder 5 may be formed of, for example, SnBi, SnBiAg, SnZn, SnZnBi, SnZnIn, SnAgBiIn, SnAgCuBi, SnIn, SnBiIn. The low melting point solder 5 may also be formed of alloys formed by adding very small amounts of different kinds of metals, for example, Al, Ag, Cu, Ge, and Ni, to the above-mentioned materials in order to improve the metal structure or wettability of the low melting point solder 5 or to prevent the surface of the low melting point solder 5 from being oxidized. The 'low melting point solder 5' means solder having a melting point in a range of about 60° C. to 200° C. In this embodiment, it is preferable to use SnBi having a melting point of about 140° C. as the low melting point solder 5. The low melting point solder 5 is formed in a fillet shape. In general, soldering is referred to as a process in which a material to be bonded and solder form an alloy. In this embodiment, the soldering also includes physical bonding.

As shown in FIG. 1, a thermosetting resin 8 is spread around the electronic component 6 and bonds the electronic component 6 and the substrate 1. The thermosetting resin 8 is applied so as to surround the electronic component 6 between the low melting point solders 5 provided at both sides of the electronic component 6 on the electrodes 3, without being applied on the electrodes 3.

As shown in FIG. 2, the thermosetting resin 8 is also interposed between the bottom surface of the electronic component 6 and the surface of the substrate 1 to adhere the surfaces. In this embodiment, the substrate 1 except for the electrodes 3 and the electrode component 6 are at least partially adhered to each other by the thermosetting resin 8. In this embodiment, for example, a cold-setting resin, a UV curable resin, as well as the thermosetting resin 8 can be used as resin. In the case of the thermosetting resin 8, after the electrode and the electronic component are bonded to each other by the low melting point solders, it is required to cure the low melting point solders at a temperature that does not deteriorate the low melting point solders. As will be described below, when a solder adhesive obtained by mixing low melting point solder and the thermosetting resin 8 is used, the bonding of the low melting point solder and the adhesion of the electronic component can be performed by one heating operation. Therefore, in one embodiment, it is especially preferable to use a solder adhesive obtained by mixing low melting point solder and the thermosetting resin 8.

In this embodiment, the electrode 3 is a conductive coating film formed of metal powder and a thermoplastic resin 12. The metal powder contains at least a spherical metal power 10 and a flake metal powder 11. The spherical metal powder 10 and the flake metal powder 11 are, for example, silver powder. The conductive coating film is formed by printing a conductive paste obtained by mixing the spherical metal powder 10, the flake metal powder 11, and the thermoplastic resin 12 in a solvent on the substrate 1 by the screen printing method, and removing the solvent by, for example, a drying or heating process.

Figure 3:
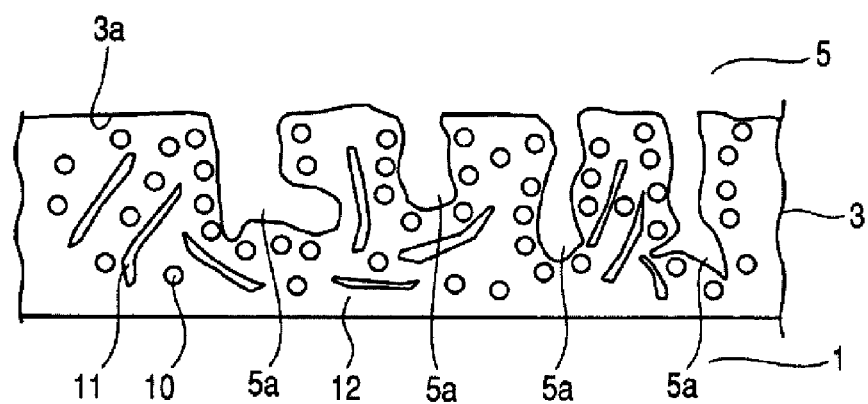
FIG. 3 is an enlarged partial view schematically showing a cross section taken by cutting the vicinity of a boundary between a low melting point solder and an electrode in the thickness direction thereof.

FIG. 3 is an enlarged partial view schematically showing a cross section when the vicinity of a boundary between the low melting point solder 5. The electrode 3 is cut in the thickness direction thereof. As shown in FIG. 3, a part 5a of the low melting point solder 5 penetrates from a surface 3a of the electrode 3 into the electrode 3 toward the substrate 1. It is considered that the low melting point solder 5 penetrates into the electrode 3 sliding down the flake metal powder 11 contained in the electrode 3. When the low melting point solder 5 excessively penetrates into the electrode 3, wires are easily broken down due to solder erosion. However, the spherical metal powder 10 prevents the low melting point solder 5 from excessively penetrating into the electrode 3. As shown in FIG. 3, the low melting point solder 5 does not reach the substrate 1. In one embodiment, it is preferable that the thickness of the electrode 3 be in a range of 5 μm to 30 μm and the low melting point solder 5 penetrate into the electrode 3 by about 5% to 95% of the thickness of the electrode 3.

FIG. 3 illustrates a state in which the solder wettability of the electrode 3 with respect to the low melting point solder 5 is good and the electric resistance between the electrode 3 and the low melting point solder 5 is low. In this embodiment, since the thermosetting resin 8 spread around the electronic component 6 strongly bonds the substrate 1 and the electronic component 6, it is possible to sufficiently improve the bonding strength between the substrate 1 and the electronic component 6.

The amount of the flake metal powder 11 with respect to the amount of metal powder in the electrode 3 is preferably about 5% to 99.5% by mass. When the amount of the flake metal powder 11 is more than about 99.5% by mass, wires are easily broken down due to solder erosion. When the amount of the flake metal powder is less than 5% by mass, the amount of spherical metal powder 10 remarkably increases, which deteriorates the solder wettability. In one embodiment, it is preferable that the amount of the flake metal powder 11 with respect to the amount of metal powder in the electrode 3 be about 5% to 99.5% by mass.

In one embodiment, it is preferable that the amount of metal powder in the electrode 3 be about 90% to 97.5% by mass. When the amount of metal powder is less than 90% by mass, undesirably, the solder wettability is deteriorated. Meanwhile, when the amount of metal powder is more than 97.5% by mass, the amount of metal powder is excessively large, and thus the conductive paste cannot be made. In one embodiment, it is preferable that the amount of metal powder in the electrode 3 be about 90% to 97.5% by mass.

In one embodiment, it is preferable that the average particle diameter of the spherical metal powder 10 be equal to or smaller than 3 μm. When the average particle diameter of the spherical metal powder 10 is larger than 3 μm, the solder erosion occurs, which causes the wires to be broken. For this reason, the average particle diameter of the spherical metal powder 10 is equal to or smaller than 3 μm. When the amount of the spherical metal powder 10 having a particle diameter that is smaller than 1 μm with respect to the amount of the spherical metal powder 10 is equal to or more than 10%, good solder wettability can be maintained. When the amount of the spherical metal powder 10 having a particle diameter that is smaller than 1 μm with respect to the amount of spherical metal powder 10 is less than 10%, the solder erosion occurs. As a result, undesirably, the wires are easily broken. The particle diameter is usually measured by a laser scattering method. However, when the particles are strongly aggregated or are not normally distributed, the particle diameter needs to be measured by, for example, a Coulter counter or an SEM (scanning electron microscope).

The average length of the flake metal powder 11 in a major axis direction is preferably within a range of about 5 μm to 50 μm. Further, the average length of the flake metal powder 11 in a minor axis direction is preferably within a range of about 0.01 μm to 3 μm. The aspect ratio of the flake metal powder 11 (the average length in the major axis direction/the average length in the minor axis direction) is preferably about 2 to 5000. Therefore, it is possible to improve the solder wettability and to appropriately reduce the electric resistance between the electrode 3 and the low melting point solder 5.

In this embodiment, dendritic metal powder other than the spherical metal powder 10 and the flake metal powder 11 may be contained.

The spherical metal powder 10 may be a perfect sphere, have an aspect ratio within a range of 1 to 2, or have an uneven surface.

When the thermoplastic resin 12 is used as a binder resin of the electrode 3, as described above, the amount of metal power of about 90% to 97.5% by mass can be contained in the electrode 3. It is possible to form a structure in which the low melting point solder 5 appropriately penetrates into the electrode 3.

The thermoplastic resin 12 is preferably a polyester resin. In one embodiment, a curing agent is contained in the electrode 3. When the electrode 3 contains the curing agent, the bonding strength between the substrate 1 and the electrode 3 can be appropriately improved. When containing the curing agent, the electrode 3 is appropriately cured and thus can appropriately maintain the structure in which the low melting point solder 5 penetrates into the electrode 3.

In one embodiment, when the electrode 3 contains an excessively large amount of curing agent, the electrode 3 is excessively quickly cured by heating for soldering. As a result, the melted low melting point solder 5 cannot appropriately penetrate into the electrode 3. In one embodiment, it is preferable that the curing agent be isocyanate. Assuming that hydroxyl equivalent of the thermoplastic resin is 1 equivalent, the isocyanate equivalent of the isocyanate be equal to or less than 2.5 equivalents. The curing agent may be a melamine compound or an epoxy resin, as well as isocyanate.

In this embodiment, the low melting point solder 5 and the thermosetting resin 8 are applied on at least the electrode 3 as a mixed solder adhesive before a heating process for melting the low melting point solder 5 and curing the thermosetting resin 8. By the heating process, the low melting point solder 5 constituting the solder adhesive is aggregated on the electrode 3 and bonding the electrode 3 and a connecting portion 7 of the electronic component 6 by soldering. The thermosetting resin 8 is separated from the low melting point solder 5 aggregated on the electrode 3, seeps through a portion on the substrate 1 except for the electrode 3, and adheres the substrate 1 and the electronic component 6.

In this embodiment, when the solder adhesive is used, the soldering between the electrode 3 and the connecting portion 7 of the electronic component 6 and the adhesion between the substrate 1 and the electronic component 6 can be performed at the same time. The bonding structure in which the low melting point solder 5 is interposed between the electrode 3 and the connecting portion 7 of the electronic component 6 becomes the state shown in FIG. 3. As a result, a good electrical connection (high conductivity) is obtained, but excellent mechanical strength is not obtained. In this embodiment, the substrate 1 and the electronic component 6 are adhered to each other by the thermosetting resin 8 spread around the electronic component 6, resulting in high bonding strength.

In this embodiment, an epoxy resin is preferably used as the thermosetting resin 8.

In this embodiment, the silver powder is used as the metal powder, but is not limited thereto. For example, the metal powder may be metal-plated copper powder, silver-coated copper powder, silver-copper alloy powder, metal-plated nickel powder, silver-coated nickel powder, and silver-nickel alloy powder, etc.

A method of manufacturing the bonding structure of the substrate 1 and the electronic component 6 shown in FIGS. 1 and 2 will be described.

As shown in FIGS. 1 and 2, the conductive patterns 2 are formed on the substrate 1 by the screen printing method. In this case, the electrode 3 and the conductive portion 4 connected to the electrode 3 are separately formed. When the electrode 3 is formed, a conductive paste is made by mixing the spherical metal powder 10, the flake metal powder 11, the thermoplastic resin 12, and the curing agent in a solvent. A dispersing agent or a thixotropic agent for improving print correction may be appropriately contained in the solvent. The conductive paste is formed in the shape of the electrode 3 by the screen printing method. A drying and heating process is performed to remove the solvent.

The formation of the conductive portion 4 is performed after or before the electrode 3 is formed. The conductive paste obtained by mixing the metal powder and the resin in the solvent is formed in the shape of the conductive portion 4 by the screen printing method. The drying and heating process for removing the solvent may be performed in the drying and heating process of the electrode 3. In one embodiment, it is preferable that the ratio of the resin with respect to the conductive paste for forming the conductive portion 4 (with respect to a solid component) be higher than the ratio of the resin with respect to the conductive paste for forming the electrode 3 (with respect to the solid component). In another embodiment, it is preferable that the ratio of the spherical metal powder with respect to the metal powder in the conductive portion 4 be higher than that in the electrode 3.

A solder adhesive obtained by mixing the low melting point solder 5, which is formed of SnBi, and the thermosetting resin 8 is applied on at least the electrodes 3 by, for example, a metal mask print method. The electronic component 6 is disposed at a predetermined position on the substrate 1. The connecting portion 7 of the electronic component 6 faces the electrode 3 with the solder adhesive interposed therebetween.

A low-temperature heating process is performed. In this embodiment, since the low melting point solder 5 is used, high-temperature heating is unnecessary, unlike the related art. The heating temperature is adjusted in consideration of the melting point of the low melting point solder 5 and the curing temperature of the thermosetting resin 8. The heating temperature is preferably adjusted to a temperature higher than the melting point of the low melting point solder and the curing temperature of the thermosetting resin. The melting point of the low melting point solder 5 formed of SnBi is within a range of about 138° C. to 140° C., and the curing temperature of the thermosetting resin 8 is within a range of about 120° C. to 150° C. In one embodiment, when the heating temperature is set within a range of 120° C. to 160° C. (preferably, a range of 150° C. to 160° C.), the soldering by the low melting point solder 5 and the thermal curing of the thermosetting resin 8 can be appropriately performed.

When the heating temperature is gradually raised, the low melting point solder 5 constituting the solder adhesive starts to be melted and aggregated between the electrode 3 and the connecting portion 7. The heating softens the electrode 3, and thus the low melting point solder 5 penetrates into the electrode 3 sliding down the flake metal powder 11 in the electrode 3. In this case, the spherical metal powder 10 prevents an excessively large amount of low melting point solder 5 from penetrating into the electrode 3.

In one embodiment, since the electrode 3 contains the curing agent, the low melting point solder 5 penetrates into the electrode 3, and then the electrode is cured such that the state shown in FIG. 3 is appropriately maintained. When the heating temperature is gradually raised, the thermosetting resin 8 is completely separated from the low melting point solder 5 aggregated on the electrode 3 and runs from above the electrode 3 to around the electronic component 6 and above the substrate 1 under the electronic component 6. When the heating temperature reaches the curing temperature, the thermosetting resin 8 is thermally cured, so that the substrate 1 and the electronic component 6 are appropriately adhered to each other by the thermosetting resin 8.

In the above-mentioned method of manufacturing the bonding structure of the substrate 1 and the electronic component 6, the solder wettability of the electrode 3 formed on the substrate 1 with respect to the low melting point solder 5 can be kept high. In the heating process, the low melting point solder 5 aggregated on the electrode 3 penetrates from the surface of the electrode 3 into the electrode 3. Therefore, the electrode 3 and the connecting portion 7 of the electronic component 6 can be appropriately soldered together by the low melting point solder 5.

In this embodiment, by the heating process, the electrode 3 and the connecting portion 7 of the electronic component 6 can be soldered together by the low melting point solder 5, for example, at the same time, the edge of the electronic component 6 can be adhered to the substrate 1 by the thermosetting resin 8. Therefore, it is possible to form the bonding structure of the substrate 1 and the electronic component 6 having a very high bonding strength by a simple method.

In this embodiment, since the heating temperature can be set to a low temperature, it is possible to reduce the thermal effect on the electronic component 6 and to prevent the resin component of the electrode 3 from being decomposed by heat or the substrate 1 formed of, for example, PET from being melted.

EXAMPLES

A conductive coating film is formed by applying a conductive paste formed under the conditions represented in the following Tables 1-A and 1-B (hereinafter, Table 1 represents both Tables 1-A and 1-B) on a PET substrate and by removing a solvent contained in the conductive paste by a drying and heating process. The conductive coating film is formed to have a width of 0.3 mm, a length of 50 mm, and a thickness of 15 μm.

TABLE 1-A

| Flake Ag powder (wt %) | Spherical Ag powder (wt %) | Average particle diameter of spherical Ag powder [μm] | Ratio of spherical Ag powder with particle diameter smaller than 1 μm (%) | Ag powder (wt %)/resin (wt %) | Amount of isocyanate | Trade name of resin |
|---|---|---|---|---|---|---|
| 100 | 0 | 1.2 | 37 | 90/10 | No isocyanate | UNITIKA UE-9900 |
|  |  |  |  | 90/10 | No isocyanate | UNITIKA UE-3690 |
|  |  |  |  | 90/10 | 2 equivalents of isocyanate | UNITIKA UE-3200 |
|  |  |  |  | 90/10 | 2 equivalents of isocyanate | VYLON550 |
|  |  |  |  | 90/10 | 0.5 equivalents of isocyanate | VYLON300 |
|  |  |  |  | 90/10 | 1 equivalent of isocyanate | VYLONGK130 |
|  |  |  |  | 95/5 | 1 equivalent of isocyanate | VYLON300&GK130 = 5:1 |
|  |  |  |  | 95/5 | 2 equivalents of isocyanate | VYLON300&GK130 = 5:1 |
| 99.5 | 0.5 | 1.2 | 37 | 90/10 | No isocyanate | UNITIKA UE-9900 |
|  |  |  |  | 90/10 | No isocyanate | UNITIKA UE-3690 |
|  |  |  |  | 90/10 | 2 equivalents of isocyanate | UNITIKA UE-3200 |
|  |  |  |  | 90/10 | 2 equivalents of isocyanate | VYLON550 |
|  |  |  |  | 90/10 | 0.5 equivalents of isocyanate | VYLON300 |
|  |  |  |  | 90/10 | 1 equivalent of isocyanate | VYLONGK130 |
|  |  |  |  | 95/5 | 1 equivalent of isocyanate | VYLON300&GK130 = 5:1 |
|  |  |  |  | 95/5 | 2 equivalents of isocyanate | VYLON300&GK130 = 5:1 |
| 99 | 1 | 1.2 | 37 | 90/10 | No isocyanate | UNITIKA UE-9900 |
|  |  |  |  | 90/10 | No isocyanate | UNITIKA UE-3690 |
|  |  |  |  | 90/10 | 2 equivalents of isocyanate | UNITIKA UE-3200 |
|  |  |  |  | 90/10 | 2 equivalents of isocyanate | VYLON550 |
|  |  |  |  | 90/10 | 0.5 equivalents of isocyanate | VYLON300 |
|  |  |  |  | 90/10 | 1 equivalent of isocyanate | VYLONGK130 |
|  |  |  |  | 95/5 | 1 equivalent of isocyanate | VYLON300&GK130 = 3:1 |
|  |  |  |  | 95/5 | 2 equivalents of isocyanate | VYLON300&GK130 = 3:1 |
| 90 | 10 | 1.2 | 37 | 90/10 | No isocyanate | UNITIKA UE-9900 |
|  |  |  |  | 90/10 | No isocyanate | UNITIKA UE-3690 |
|  |  |  |  | 90/10 | 2 equivalents of isocyanate | UNITIKA UE-3200 |
|  |  |  |  | 90/10 | 2 equivalents of isocyanate | VYLON550 |
|  |  |  |  | 90/10 | 0.5 equivalents of isocyanate | VYLON300 |
|  |  |  |  | 90/10 | 1 equivalent of isocyanate | VYLONGK130 |
|  |  |  |  | 95/5 | 1 equivalent of isocyanate | VYLON300&GK130 = 2:1 |
|  |  |  |  | 95/5 | 2 equivalents of isocyanate | VYLON300&GK130 = 2:1 |

TABLE 1-A-continued

| Flake Ag powder (wt %) | Spherical Ag powder (wt %) | Average particle diameter of spherical Ag powder [μm] | Ratio of spherical Ag powder with particle diameter smaller than 1 μm (%) | | | Trade name of resin |
|---|---|---|---|---|---|---|
| 50 | 50 | 1.2 | 37 | 90/10 | No isocyanate | UNITIKA UE-9900 |
| ↓ | ↓ | ↓ | ↓ | 90/10 | No isocyanate | UNITIKA UE-3650 |
| | | | | 90/10 | 2 equivalents of isocyanate | UNITIKA UE-3200 |
| | | | | 90/10 | 2 equivalents of isocyanate | VYLON550 |
| | | | | 90/10 | 0.5 equivalents of isocyanate | VYLON300 |
| | | | | 90/10 | 1 equivalent of isocyanate | VYLONGK130 |
| | | | | 95/5 | 1 equivalent of isocyanate | VYLON300&GK130 = 3:1 |
| | | | | 95/5 | 2 equivalents of isocyanate | VYLON300&GK130 = 3:1 |
| | | | | 97.5/2.5 | 2 equivalents of isocyanate | VYLON300&GK130 = 3:1 |
| | | | | 98/2 | 2 equivalents of isocyanate | VYLON300&GK130 = 3:1 |
| | | | | 95/5 | 2.5 equivalents of isocyanate | VYLON300&GK130 = 3:1 |
| | | 0.9 | $55^{-1}$ | 95/5 | 3 equivalents of isocyanate | VYLON300&GK130 = 3:1 |
| | | 2.3 | $10^{-2}$ | 95/5 | 5 equivalents of isocyanate | VYLON300&GK130 = 3:1 |
| | | 5.3 | $2^{-3}$ | 95/5 | 2 equivalents of isocyanate | VYLON300&GK130 = 3:1 |
| ↓ | ↓ | | | 95/5 | 2 equivalents of isocyanate | VYLON300&GK130 = 3:1 |
| | | | | 95/5 | 2 equivalents of isocyanate | VYLON300&GK130 = 3:1 |

| Flake Ag powder (wt %) | Spherical Ag powder (wt %) | Average particle diameter of spherical Ag powder [μm] | Ratio of spherical Ag powder with particle diameter smaller than 1 μm (%) | Tg (° C.) | Resin solid content (parts by weight) | Flake Ag powder (parts by weight) | Spherical Ag powder (parts by weight) | Trade name of curing agent (parts by weight) |
|---|---|---|---|---|---|---|---|---|
| 100 | 0 | 1.2 | 37 | 101 | 10 | 90.0 | 0 | — |
| ↓ | ↓ | ↓ | ↓ | 90 | 10 | 90.0 | 0 | — |
| | | | | 65 | 10 | 90.0 | 0 | CORONET2516 |
| | | | | −15 | 10 | 90.0 | 0 | CORONET2516 |
| | | | | 7 | 10 | 90.0 | 0 | CORONET2516 |
| | | | | 15 | 10 | 90.0 | 0 | CORONET2516 |
| | | | | — | 4.17:0.83 | 95 | 0 | CORONET2516 |
| | | | | — | 4.17:0.83 | 95 | 0 | CORONET2516 |
| 99.5 | 0.5 | 1.2 | 37 | 101 | 10 | 69.55 | 0.45 | — |
| | | | | 90 | 10 | 69.55 | 0.45 | — |
| | | | | 65 | 10 | 69.55 | 0.45 | CORONET2516 |
| | | | | −15 | 10 | 69.55 | 0.45 | CORONET2516 |
| | | | | 7 | 10 | 69.55 | 0.45 | CORONET2516 |
| | | | | 15 | 10 | 69.55 | 0.45 | CORONET2516 |
| | | | | — | 4.17:0.83 | 94.53 | 0.46 | CORONET2516 |
| | | | | — | 4.17:0.83 | 94.53 | 0.46 | CORONET2516 |
| 99 | 1 | 1.2 | 37 | 101 | 10 | 69.1 | 0.9 | — |
| | | | | 90 | 10 | 69.1 | 0.9 | — |
| | | | | 65 | 10 | 69.1 | 0.9 | CORONET2516 |
| | | | | −15 | 10 | 69.1 | 0.9 | CORONET2516 |
| | | | | 7 | 10 | 69.1 | 0.9 | CORONET2516 |
| | | | | 15 | 10 | 69.1 | 0.9 | CORONET2516 |
| | | | | — | 3.75:1.25 | 94.05 | 0.95 | CORONET2516 |
| | | | | — | 3.75:1.25 | 94.05 | 0.95 | CORONET2516 |
| 90 | 10 | 1.2 | 37 | 101 | 10 | 61.0 | 9.0 | — |
| | | | | 90 | 10 | 61.0 | 9.0 | — |
| | | | | 65 | 10 | 61.0 | 9.0 | CORONET2516 |
| | | | | −15 | 10 | 61.0 | 9.0 | CORONET2516 |
| | | | | 7 | 10 | 61.0 | 9.0 | CORONET2516 |
| | | | | 15 | 10 | 61.0 | 9.0 | CORONET2516 |
| | | | | — | 3.33:1.67 | 65.5 | 9.6 | CORONET2516 |
| | | | | — | 3.33:1.67 | 85.5 | 9.6 | CORONET2516 |
| 50 | 50 | 1.2 | 37 | 101 | 10 | 45.0 | 45.0 | — |
| | | | | 90 | 10 | 45.0 | 45.0 | — |
| | | | | 65 | 10 | 45.0 | 45.0 | CORONET2516 |
| | | | | −15 | 10 | 45.0 | 45.0 | CORONET2516 |
| | | | | 7 | 10 | 45.0 | 45.0 | CORONET2516 |
| | | | | 15 | 10 | 45.0 | 45.0 | CORONET2516 |
| | | | | — | 3.75:1.25 | 47.5 | 47.5 | CORONET2516 |
| | | | | — | 3.75:1.25 | 47.5 | 47.5 | CORONET2516 |
| | | | | — | 1.88:0.63 | 48.75 | 48.75 | CORONET2516 |
| | | | | — | 1.50:0.50 | 49.0 | 49.0 | CORONET2516 |
| | | | | — | 3.75:1.25 | 47.5 | 47.5 | CORONET2516 |
| | | 0.9 | $55^{-1}$ | — | 3.75:1.25 | 47.5 | 47.5 | CORONET2516 |
| | | 2.3 | $10^{-2}$ | — | 3.75:1.25 | 47.5 | 47.5 | CORONET2516 |
| | | 5.3 | $2^{-3}$ | — | 3.75:1.25 | 47.5 | 47.5 | CORONET2516 |
| ↓ | ↓ | | | — | 3.75:1.25 | 47.5 | 47.5 | CORONET2516 |
| | | | | — | 3.75:1.25 | 47.5 | 47.5 | CORONET2516 |

TABLE 1-A-continued

| Flake Ag powder (wt %) | Spherical Ag powder (wt %) | Average particle diameter of spherical Ag powder [μm] | Ratio of spherical Ag powder with particle diameter smaller than 1 μm (%) | Amount of curing agent (parts by weight) | wettability | Conductive resistance (Ω) | |
|---|---|---|---|---|---|---|---|
| 100 | 0 | 1.2 | 37 | — | X | Breaking of wire due to solder erosion | Comparative example |
| ↓ | ↓ | ↓ | ↓ | — | X | | |
| | | | | 0.86 | X | | |
| | | | | 0.58 | X | | |
| | | | | 0.18 | X | | |
| | | | | 1.37 | X | | |
| | | | | 0.26 | X | | |
| | | | | 0.53 | X | | |
| 99.5 | 0.5 | 1.2 | 37 | — | 0 | 9.5 | |
| ↓ | ↓ | ↓ | ↓ | — | 0 | 8.5 | |
| | | | | 0.86 | 0 | 9.2 | |
| | | | | 0.58 | 0 | 9.2 | |
| | | | | 0.18 | 0 | 7.3 | |
| | | | | 1.37 | 0 | 9.4 | |
| | | | | 0.26 | 0 | 7.2 | |
| | | | | 0.53 | 0 | 9.9 | |
| 99 | 1 | 1.2 | 37 | — | 0 | 9.2 | |
| ↓ | ↓ | ↓ | ↓ | — | 0 | 9.6 | |
| | | | | 0.86 | 0 | 8.1 | |
| | | | | 0.58 | 0 | 9.5 | |
| | | | | 0.18 | 0 | 9.0 | |
| | | | | 1.37 | 0 | 8.9 | |
| | | | | 0.31 | 0 | 7.5 | |
| | | | | 0.61 | 0 | 10.2 | |
| 90 | 10 | 1.2 | 37 | — | 0 | 9.9 | |
| ↓ | ↓ | ↓ | ↓ | — | 0 | 9.0 | |
| | | | | 0.86 | 0 | 8.7 | |
| | | | | 0.58 | 0 | 9.2 | |
| | | | | 0.18 | 0 | 6.4 | |
| | | | | 1.37 | 0 | 9.5 | |
| | | | | 0.35 | 0 | 7.0 | |
| | | | | 0.70 | 0 | 9.6 | |
| 50 | 50 | 1.2 | 37 | — | 0 | 11.8 | |
| ↓ | ↓ | ↓ | ↓ | — | 0 | 20.4 | |
| | | | | 0.86 | 0 | 11.1 | |
| | | | | 0.58 | 0 | 10.3 | |
| | | | | 0.16 | 0 | 10.3 | |
| | | | | 1.37 | 0 | 10.7 | |
| | | | | 0.31 | 0 | 10.5 | |
| | | | | 0.61 | 0 | 11.9 | First example |
| | | | | 0.31 | 0 | 9.0 | |
| | | | | 0.25 | Paste cannot be formed due to excessive amount of conductive powder | | Fourth comparative example |
| | | | | 0.77 | 0 | 12.5 | |
| | | | | 0.92 | X | 183.7 | First comparative example |
| | | 0.9 | 55⁻¹ | | | | |
| | | 2.3 | 10⁻² | 1.53 | X | 196.3 | Second comparative example |
| | | 5.3 | 2⁻³ | | | | |
| | | ↓ | ↓ | 0.61 | 0 | 8.3 | |
| | | | | 0.61 | 0 | 14.7 | |
| | | | | 0.61 | X | Breaking of wire due to solder erosion | Third comparative example |

TABLE 1-B

| Flake Ag powder (wt %) | Spherical Ag powder (wt %) | Average particle diameter of spherical Ag powder [μm] | Ratio of spherical Ag powder with particle diameter smaller than 1 μm (%) | Ag powder (wt %)/resin (wt %) | Amount of isocyanate | Trade name of resin |
|---|---|---|---|---|---|---|
| 10 | 90 | 1.2 | 37 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |
| 5 | 95 | 1.2 | 37 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |
| 1 | 99 | 1.2 | 37 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |
| 99.5 | 0.5 | 5.3 | 0 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |
| 50 | 50 | 5.3 | 0 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |
| 5 | 95 | 5.3 | 0 | 90/10 | No isocyanate | UNITIKA UE-9900 |
| ↓ | ↓ | ↓ | ↓ | 90/10 | No isocyanate | UNITIKA UE-3690 |
| ↓ | ↓ | ↓ | ↓ | 90/10 | 2 equivalents of isocyanate | UNITIKA UE-3200 |
| ↓ | ↓ | ↓ | ↓ | 90/10 | 2 equivalents of isocyanate | VYLON550 |
| ↓ | ↓ | ↓ | ↓ | 90/10 | 0.5 equivalents of isocyanate | VYLON300 |
| ↓ | ↓ | ↓ | ↓ | 90/10 | 1 equivalent of isocyanate | VYLONGK130 |
| ↓ | ↓ | ↓ | ↓ | 95/5 | 1 equivalent of isocyanate | VYLON300&GK130=5:1 |
| ↓ | ↓ | ↓ | ↓ | 95/5 | 2 equivalents of isocyanate | VYLON300&GK130=5:1 |

| Flake Ag powder (wt %) | Spherical Ag powder (wt %) | Average particle diameter of spherical Ag powder [μm] | Ratio of spherical Ag powder with particle diameter smaller than 1 μm (%) | Tg (°C.) | Resin solid content (parts by weight) | Flake Ag powder (parts by weight) | Spherical Ag powder (parts by weight) | Trade name of curing agent (parts by weight) |
|---|---|---|---|---|---|---|---|---|
| 10 | 90 | 1.2 | 37 | 101 | 10 | 9.0 | 61.0 | — |
| ↓ | ↓ | ↓ | ↓ | 90 | 10 | 9.0 | 61.0 | — |
| ↓ | ↓ | ↓ | ↓ | 65 | 10 | 9.0 | 61.0 | CORONET2516 |
| ↓ | ↓ | ↓ | ↓ | −15 | 10 | 9.0 | 61.0 | CORONET2516 |
| ↓ | ↓ | ↓ | ↓ | 7 | 10 | 9.0 | 61.0 | CORONET2516 |
| ↓ | ↓ | ↓ | ↓ | 15 | 10 | 9.0 | 61.0 | CORONET2516 |
| ↓ | ↓ | ↓ | ↓ | — | 3.75:1.25 | 9.5 | 65.5 | CORONET2516 |
| ↓ | ↓ | ↓ | ↓ | — | 3.75:1.25 | 9.5 | 65.5 | CORONET2516 |
| 5 | 95 | 1.2 | 37 | 101 | 10 | 4.5 | 65.5 | — |
| ↓ | ↓ | ↓ | ↓ | 90 | 10 | 4.5 | 65.5 | — |
| ↓ | ↓ | ↓ | ↓ | 65 | 10 | 4.5 | 65.5 | CORONET2516 |
| ↓ | ↓ | ↓ | ↓ | −15 | 10 | 4.5 | 65.5 | CORONET2516 |
| ↓ | ↓ | ↓ | ↓ | 7 | 10 | 4.5 | 65.5 | CORONET2516 |
| ↓ | ↓ | ↓ | ↓ | 15 | 10 | 4.5 | 65.5 | CORONET2516 |
| ↓ | ↓ | ↓ | ↓ | — | 3.75:1.25 | 4.75 | 90.26 | CORONET2516 |
| ↓ | ↓ | ↓ | ↓ | — | 3.75:1.25 | 4.75 | 90.26 | CORONET2516 |

TABLE 1-B-continued

| Flake Ag powder (wt %) | Spherical Ag powder (wt %) | Average particle diameter of spherical Ag powder [μm] | Ratio of spherical Ag powder with particle diameter smaller than 1 μm (%) | | | | | |
|---|---|---|---|---|---|---|---|---|
| 1 | 99 | 1.2 | 37 | 101 | 10 | 0.9 | 89.1 | — |
| ↓ | ↓ | ↓ | ↓ | 90 | 10 | 0.9 | 89.1 | — |
| ↓ | ↓ | ↓ | ↓ | 65 | 10 | 0.9 | 89.1 | CORONET2516 |
| ↓ | ↓ | ↓ | ↓ | −15 | 10 | 0.9 | 89.1 | CORONET2516 |
| ↓ | ↓ | ↓ | ↓ | 7 | 10 | 0.9 | 89.1 | CORONET2516 |
| ↓ | ↓ | ↓ | ↓ | 15 | 10 | 0.9 | 89.1 | CORONET2516 |
| ↓ | ↓ | ↓ | ↓ | — | 3.75:1.25 | 0.95 | 94.04 | CORONET2516 |
| ↓ | ↓ | ↓ | ↓ | — | 3.75:1.25 | 0.95 | 94.04 | CORONET2516 |
| 99.5 | 0.5 | 5.3 | 0 | 101 | 10 | 0.9 | 69.1 | — |
| ↓ | ↓ | ↓ | ↓ | 90 | 10 | 0.9 | 69.1 | — |
| ↓ | ↓ | ↓ | ↓ | 65 | 10 | 0.9 | 69.1 | CORONET2516 |
| ↓ | ↓ | ↓ | ↓ | −15 | 10 | 0.9 | 69.1 | CORONET2516 |
| ↓ | ↓ | ↓ | ↓ | 7 | 10 | 0.9 | 69.1 | CORONET2516 |
| ↓ | ↓ | ↓ | ↓ | 15 | 10 | 0.9 | 69.1 | CORONET2516 |
| ↓ | ↓ | ↓ | ↓ | — | 3.75:1.25 | 0.48 | 94.53 | CORONET2516 |
| ↓ | ↓ | ↓ | ↓ | — | 3.75:1.25 | 0.48 | 94.53 | CORONET2516 |
| 50 | 50 | 5.3 | 0 | 101 | 10 | 0.9 | 69.1 | — |
| ↓ | ↓ | ↓ | ↓ | 90 | 10 | 0.9 | 69.1 | — |
| ↓ | ↓ | ↓ | ↓ | 65 | 10 | 0.9 | 69.1 | CORONET2516 |
| ↓ | ↓ | ↓ | ↓ | −15 | 10 | 0.9 | 69.1 | CORONET2516 |
| ↓ | ↓ | ↓ | ↓ | 7 | 10 | 0.9 | 69.1 | CORONET2516 |
| ↓ | ↓ | ↓ | ↓ | 15 | 10 | 0.9 | 69.1 | CORONET2516 |
| ↓ | ↓ | ↓ | ↓ | — | 3.75:1.25 | 47.5 | 47.5 | CORONET2516 |
| ↓ | ↓ | ↓ | ↓ | — | 3.75:1.25 | 47.5 | 47.5 | CORONET2516 |
| 5 | 95 | 5.3 | 0 | 101 | 10 | 0.9 | 69.1 | — |
| ↓ | ↓ | ↓ | ↓ | 90 | 10 | 0.9 | 69.1 | — |
| ↓ | ↓ | ↓ | ↓ | 65 | 10 | 0.9 | 69.1 | CORONET2516 |
| ↓ | ↓ | ↓ | ↓ | −15 | 10 | 0.9 | 69.1 | CORONET2516 |
| ↓ | ↓ | ↓ | ↓ | 7 | 10 | 0.9 | 69.1 | CORONET2516 |
| ↓ | ↓ | ↓ | ↓ | 15 | 10 | 0.9 | 69.1 | CORONET2516 |
| ↓ | ↓ | ↓ | ↓ | — | 3.75:1.25 | 47.5 | 90.25 | CORONET2516 |
| ↓ | ↓ | ↓ | ↓ | — | 3.75:1.25 | 47.5 | 90.25 | CORONET2516 |

| Flake Ag powder (wt %) | Spherical Ag powder (wt %) | Average particle diameter of spherical Ag powder [μm] | Ratio of spherical Ag powder with particle diameter smaller than 1 μm (%) | Amount of curing agent (parts by weight) | wettability | Conductive resistance (Ω) | |
|---|---|---|---|---|---|---|---|
| 10 | 90 | 1.2 | 37 | — | 0 | 28.4 | |
| ↓ | ↓ | ↓ | ↓ | — | 0 | 26.0 | |
| ↓ | ↓ | ↓ | ↓ | 0.86 | 0 | 25.2 | |
| ↓ | ↓ | ↓ | ↓ | 0.58 | 0 | 26.5 | |
| ↓ | ↓ | ↓ | ↓ | 0.18 | 0 | 26.3 | |
| ↓ | ↓ | ↓ | ↓ | 1.37 | 0 | 27.0 | |
| ↓ | ↓ | ↓ | ↓ | 0.31 | 0 | 25.2 | |
| ↓ | ↓ | ↓ | ↓ | 0.61 | 0 | 31.5 | |
| 5 | 95 | 1.2 | 37 | — | 0 | 159.6 | Fifth comparative example |
| ↓ | ↓ | ↓ | ↓ | — | 0 | 157.1 | Sixth comparative example |
| ↓ | ↓ | ↓ | ↓ | 0.86 | 0 | 135.0 | |
| ↓ | ↓ | ↓ | ↓ | 0.58 | 0 | 123.7 | |
| ↓ | ↓ | ↓ | ↓ | 0.18 | 0 | 119.0 | |
| ↓ | ↓ | ↓ | ↓ | 1.37 | 0 | 125.4 | |
| ↓ | ↓ | ↓ | ↓ | 0.31 | 0 | 107.1 | |
| ↓ | ↓ | ↓ | ↓ | 0.61 | 0 | 124.3 | |
| 1 | 99 | 1.2 | 37 | — | X | ∞ | Comparative examples |
| ↓ | ↓ | ↓ | ↓ | — | X | ∞ | |
| ↓ | ↓ | ↓ | ↓ | 0.86 | X | ∞ | |
| ↓ | ↓ | ↓ | ↓ | 0.58 | X | ∞ | |
| ↓ | ↓ | ↓ | ↓ | 0.18 | X | ∞ | |
| ↓ | ↓ | ↓ | ↓ | 1.37 | X | ∞ | |
| ↓ | ↓ | ↓ | ↓ | 0.31 | X | ∞ | |
| ↓ | ↓ | ↓ | ↓ | 0.61 | X | ∞ | |
| 99.5 | 0.5 | 5.3 | 0 | — | X | Breaking of wire due to solder erosion | |
| ↓ | ↓ | ↓ | ↓ | — | X | | |
| ↓ | ↓ | ↓ | ↓ | 0.86 | X | | |
| ↓ | ↓ | ↓ | ↓ | 0.58 | X | | |
| ↓ | ↓ | ↓ | ↓ | 0.18 | X | | |
| ↓ | ↓ | ↓ | ↓ | 1.37 | X | | |
| ↓ | ↓ | ↓ | ↓ | 0.31 | X | | |
| ↓ | ↓ | ↓ | ↓ | 0.61 | X | | |

TABLE 1-B-continued

| | | | | | | |
|---|---|---|---|---|---|---|
| 50 | 50 | 5.3 | 0 | — | X | Breaking |
| ↓ | ↓ | ↓ | ↓ | — | X | of wire |
| | | | | 0.86 | X | due to |
| | | | | 0.58 | X | solder |
| | | | | 0.16 | X | erosion |
| | | | | 1.37 | X | |
| | | | | 0.31 | X | |
| ↓ | ↓ | ↓ | ↓ | 0.61 | X | |
| 5 | 95 | 5.3 | 0 | — | Δ(irregularity) | 363.2 |
| ↓ | ↓ | ↓ | ↓ | — | Δ(irregularity) | 320.5 |
| | | | | 0.86 | Δ(irregularity) | 256.1 |
| | | | | 0.58 | Δ(irregularity) | 222.6 |
| | | | | 0.16 | Δ(irregularity) | 220.4 |
| | | | | 1.37 | Δ(irregularity) | 263.0 |
| | | | | 0.31 | Δ(irregularity) | 212.3 |
| ↓ | ↓ | ↓ | ↓ | 0.61 | Δ(irregularity) | 268.5 |

Then, a solder adhesive (SUPER ARZERITE TCAP-5401-11 made by TAMURA KAKEN CORPORATION) containing SnBi (Sn 42% and Bi 58%) as a low melting point solder is applied at the center of the conductive coating film so as to have a width of 0.5 mm, a length of 30 mm, and a thickness of 0.15 mm. Subsequently, a heating process is performed at 160° C.

It is determined using the human eye whether the solder wettability shown in Tables 1-A and 1-B is regular. The solder adhesive at the center of the conductive coating film is melted by a heating process and is bonded to the conductive coating film. Conductive resistance is measured by using both ends of the conductive coating film with a cured epoxy resin, which is a thermosetting resin, contained in the solder adhesive.

In Tables 1-A and 1-B, some samples are specified as examples and comparative examples, and the other samples are unspecified. The unspecified samples are all examples.

As shown in Table 1-A, after checking the samples having bad solder wettability, it is found that, in both the first and second comparative examples, the amount of isocyanate is more than 2.5 equivalents. As described above, it is found that, since a large amount of isocyanate is contained in the first and second comparative examples as compared to other samples, the solder wettability is deteriorated. Therefore, in the above-mentioned embodiment, the amount of isocyanate (curing agent) is defined to 2.5 equivalents or less. In the fifth and sixth comparative examples, shown in Table 1-B, the solder wettability is good, but the conductive resistance is high. In both the fifth and sixth comparative examples, the amount of isocyanate is 0 equivalent. Even when the amount of isocyanate is 0 equivalent, samples having good results exist as shown in Table 1. However, in the fifth and sixth comparative examples, even when the amount of isocyanate is 0 equivalent, since a condition that the amount of the flake Ag powder is small is added, the conductive resistance is higher, as compared to samples having good results.

However, even when the amount of the flake Ag powder is small as in the fifth and sixth comparative examples, it can be found from Table 1 that it is possible to reduce the conductive resistance by increasing the amount of isocyanate. Therefore, in the above-mentioned embodiment, it is found that the amount of isocyanate is preferably more than 0 equivalent.

In a third comparative example, the solder wettability is bad, and the breaking of wire occurs due to solder erosion. As shown in Table 1, in the third comparative example, it is found that, since the ratio of particles having a diameter of 1 μm or less in the spherical metal powder is 2%, for example, a large number of particles having large diameters are contained in the spherical metal powder as compared to other samples, the solder wettability is deteriorated. As shown in Table 1, in the comparative examples in which the ratio of particles having a diameter of 1 μm or less in the spherical metal powder is 0%, similar to the third comparative example, the breaking of wire occurs due to the solder erosion, the solder wettability is deteriorated, or the conductive resistance excessively increases. For this reason, the ratio of particles having a diameter of 1 μm or less in the spherical metal powder is defined to 10% or more as shown in Table 1.

As shown in Table 1-A, in the third comparative example, the average particle diameter of the spherical metal powder is 5.3 μm. It is found that the average particle diameter of the spherical metal powder is larger than that in an example. In the third comparative example and other comparative examples in which the average particle diameter of the spherical metal powder is 5.5 μm, the breaking of wire occurs due to the solder erosion, or the conductive resistance excessively increases. For this reason, the average particle diameter of the spherical metal powder is defined to 3 μm or less (preferably, 2.3 μm or less, and more preferably, 1.2 μm or less) as shown in Table 1.

As shown in Table 1-A, in a fourth comparative example, since an excessively large amount of metal powder is contained, it is difficult to appropriately form a conductive paste. In the fourth comparative example, assuming that the total amount of the metal powder and the resin is 100% by mass, the metal powder of 98% by mass is contained. Therefore, the amount of the metal powder is defined to 90% to 97.5% by mass on the basis of the results shown in Table 1.

As shown in Table 1, it is found that, when the ratio of the flake Ag powder in the Ag powder is excessively low, the solder wettability is deteriorated and the conductive resistance excessively increases (becomes an infinite value). It is considered that the reason is because, when the ratio of the flake Ag powder in the Ag powder is low, the low melting point solder cannot penetrate into the electrode. It is found that, when the ratio of the flake Ag powder in the Ag powder is 100% by mass, the breaking of wire occurs due to the solder erosion. For this reason, the amount of flake Ag powder in the metal powder is defined to 5% to 99.5% by mass on the basis of the experiment results shown in Table 1.

The SEM (scanning electron microscope) image of the section in the thickness direction of the bonding structure of the conductive coating film and the low melting point solder of the first example is observed through SEM. The SEM images are shown in FIGS. 4 to 6.

Figure 4:
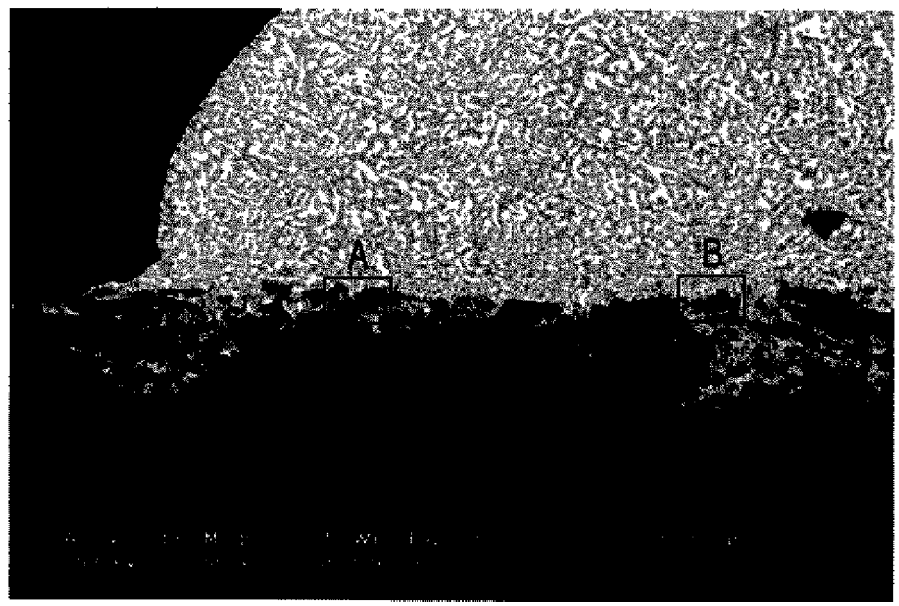
FIG. 4 shows a picture of an SEM image of a section of a bonding structure of a conductive coating film and a low melting point solder of a first example in Table 1-A.
Figure 5:
FIG. 5 shows an enlarged picture of a portion of the SEM image of the section of the bonding structure of the conductive coating film and the low melting point solder of the first example in Table 1-A.
Figure 6:
FIG. 6 shows an enlarged picture of another portion of the SEM image of the section of the bonding structure of the conductive coating film and the low melting point solder of the first example in Table 1-A.

FIG. 5 shows an enlarged picture of a portion A of the SEM image shown in FIG. 4, and FIG. 6 shows an enlarged picture of a portion B of the SEM image shown in FIG. 4.

It is found that a part of the low melting point solder formed of SnBi penetrates from the surface of the conductive coating film into the conductive coating film as a schematic view of FIG. 3, as shown in FIGS. 4 to 6.

The SEM image of the section in the thickness direction of the bonding structure of the conductive coating film and the low melting point solder of the second comparative example is observed through the SEM. The SEM images are shown in FIGS. 7 and 8.

Figure 7:
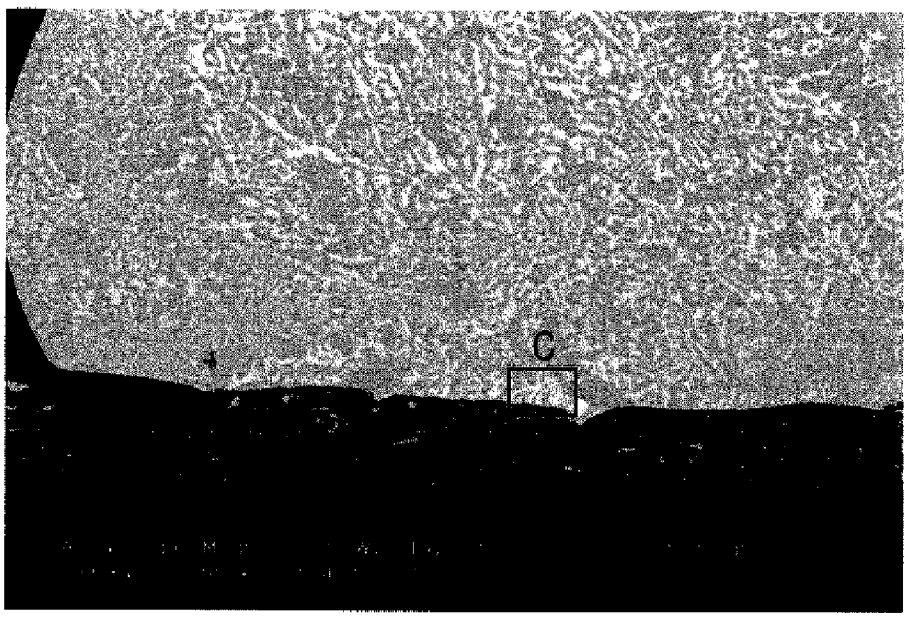
FIG. 7 shows a picture of an SEM image of a section of a bonding structure of a conductive coating film and a low melting point solder of a second comparative example in Table 1-A.
Figure 8:
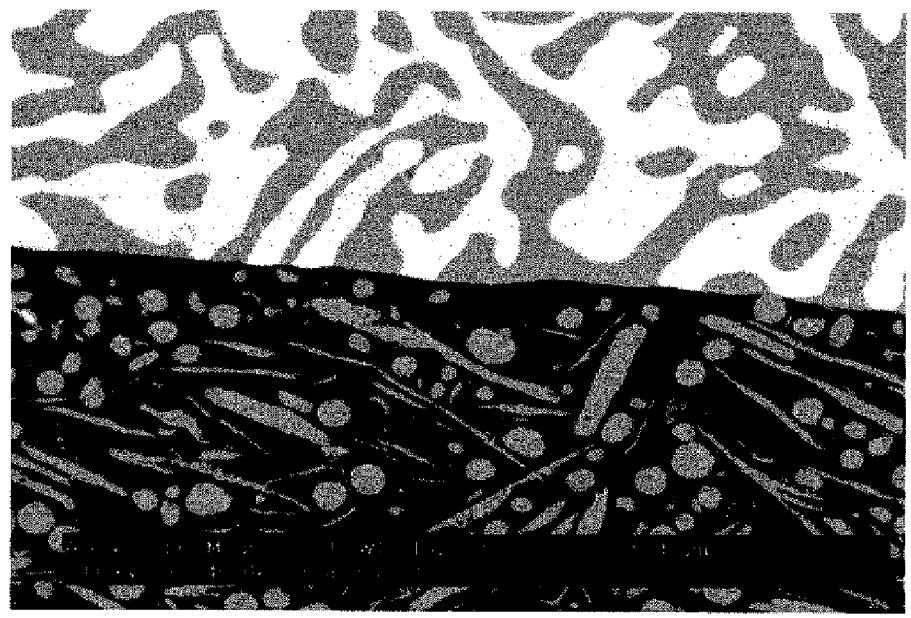
FIG. 8 shows an enlarged picture of a portion of the SEM image of the section of the bonding structure of the conductive coating film and the low melting point solder of the second comparative example in Table 1-A.

FIG. 8 shows an enlarged picture of a portion C of the SEM image shown in FIG. 7. It is found that the low melting point solder formed of SnBi penetrates from the surface of the conductive coating film into the conductive coating film, as shown in FIGS. 7 and 8.

A conductive coating film is formed by applying a conductive paste that is obtained by mixing phenol resin and the spherical Ag-coated copper powder (Ag 1.7%) in a solvent as resin and metal powder, and by removing the solvent in a drying and heating process. The solder adhesive used in the experiment of Table 1 is applied on the conductive coating film and then a heating process is performed at 160° C. The widths, lengths, and thicknesses of the conductive coating film and the SnBi solder are the same as those in the sample used in the experiment of Table 1.

The SEM image of the section in the thickness direction of the bonding structure of the conductive coating film and the low melting point solder of the second comparative example is observed through the SEM. The SEM images are shown in FIGS. 9 to 12 (comparative example).

Figure 9:
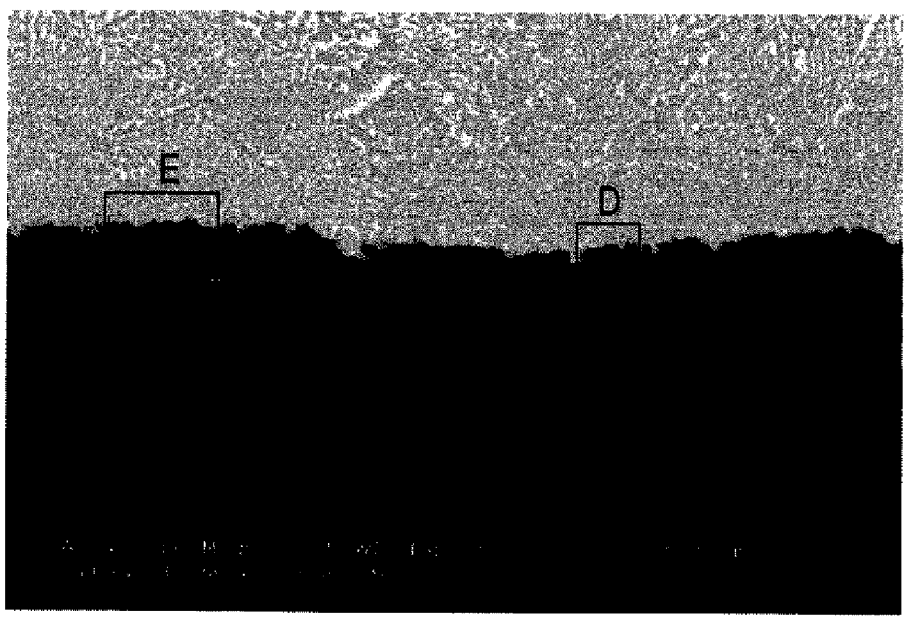
FIG. 9 shows a picture of an SEM image of a section of a bonding structure of a low melting point solder and a conductive coating film containing phenol resin and spherical Ag-coated copper powder (Ag 1.7%) (comparative example)
Figure 10:
FIG. 10 shows an enlarged picture of a portion of the SEM image of the section of the bonding structure of the low melting point solder and the conductive coating film containing the phenol resin and the spherical Ag-coated copper powder (Ag 1.7%) (the comparative example)
Figure 11:
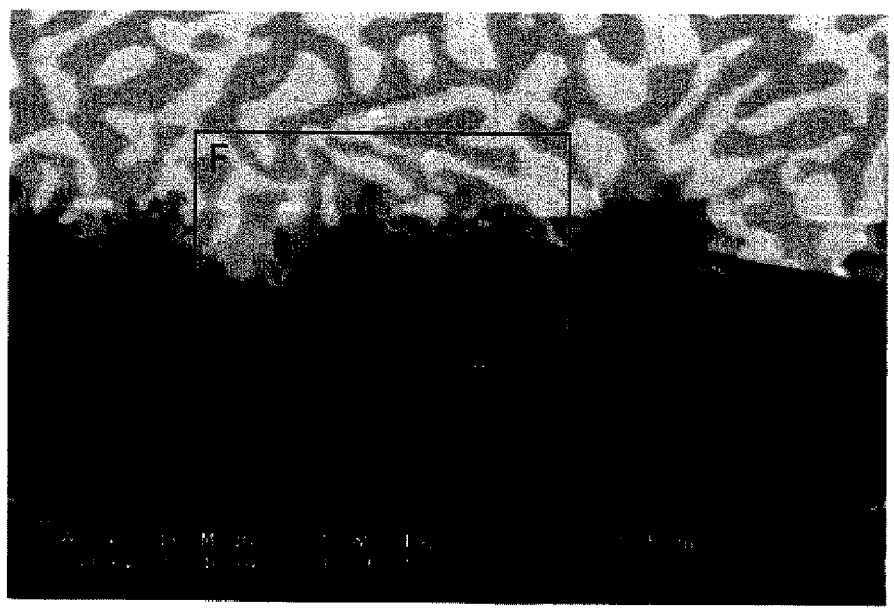
FIG. 11 shows an enlarged picture of another portion of the SEM image of the section of the bonding structure of the low melting point solder and the conductive coating film containing the phenol resin and the spherical Ag-coated copper powder (Ag 1.7%) (the comparative example)
Figure 12:
FIG. 12 shows an enlarged picture of another portion of the SEM image of the section of the bonding structure of the low melting point solder and the conductive coating film containing the phenol resin and the spherical Ag-coated copper powder (Ag 1.7%) (the comparative example).

FIG. 10 shows an enlarged picture of a portion D shown in FIG. 9. FIG. 11 shows an enlarged picture of a portion E shown in FIG. 9. FIG. 12 shows an enlarged picture of a portion F shown in FIG. 11. It is found that the low melting point solder penetrates into the electrode, as shown in FIGS. 9 to 12.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A bonding structure of a substrate and a component comprising:
   an electrode contains metal powder, polyester resin, and a curing agent that is equal to or less than 2.5 equivalents assuming that the hydroxyl equivalent of the polyester resin is 1 equivalent; and
   a low melting point solder that bonds the component to the electrode,
   wherein the low melting point solder comprises SnBi alloy and has a melting point equal to or lower than 200° C.,
   wherein the metal powder contains at least spherical metal powder and flake metal powder, and the low melting point solder is infiltrated from the surface of the electrode into the electrode by about 5% to 95% of the thickness of the electrode,
   wherein the component and the substrate, except for the electrode, are at least partially bonded to each other by resin,
   wherein the resin is a thermosetting resin,
   wherein the low melting point solder and the thermosetting resin are disposed on at least the electrode as a solder adhesive before heating,
   wherein the amount of metal powder in the electrode is about 90% to 97.5% by mass,
   wherein due to the heating, the low melting point solder is aggregated on and infiltrated into the electrode, and the thermosetting resin seeps into a portion on the substrate except for the electrode, and
   wherein the thermosetting resin is filled between a lower part of the component and the substrate so that the lower part of the component and an upper surface of the substrate are adhered to each other, and a periphery of the component is covered by the thermosetting resin to increase bonding strength.

2. The bonding structure of a substrate and a component according to claim 1,
   wherein the amount of flake metal powder in the metal powder is about 5% to 99.5% by mass.

3. The bonding structure of a substrate and a component according to claim 1,
   wherein the average particle diameter of the spherical metal powder is about 3 μm or smaller.

4. The bonding structure of a substrate and a component according to claim 1,
   wherein the resin component is a thermoplastic resin.

5. The bonding structure of a substrate and a component according to claim 1,
   wherein the curing agent is an isocyanate compound, and assuming that hydroxyl equivalent of the thermoplastic resin is 1 equivalent, the equivalent of isocyanate is equal to or less than 2.5 equivalents.

6. The bonding structure of a substrate and a component according to claim 1,
   wherein a boundary of the low melting point solder in the electrode is irregular.

7. A method of manufacturing a bonding structure of a substrate and a component comprising:
   forming on the substrate an electrode containing spherical metal powder, polyester resin, flake metal powder, and a curing agent that is equal to or less than 2.5 equivalents assuming that the hydroxyl equivalent of the polyester resin is 1 equivalent;
   applying a solder adhesive containing a low melting point solder and a thermosetting resin at least between the electrode and the component; and
   bonding the substrate to the component by the thermosetting resin by performing low-temperature heating such that the low melting point solder is aggregated on the electrode and is infiltrated from the surface of the electrode into the electrode by about 5% to 95% of the thickness of the electrode to bond the electrode to the component by the low melting point solder, and the thermosetting resin seeps into at least a portion on the substrate except for the electrode,
   wherein the component and the substrate, except for the electrode, are at least partially bonded to each other by resin,
   wherein the resin is a thermosetting resin,
   wherein the low melting point solder comprises SnBi alloy and has a melting point equal to or lower than 200° C.,
   wherein the low melting point solder and the thermosetting resin are mixed and applied onto at least the electrode as a solder adhesive before heating,
   wherein the amount of metal powder in the electrode is about 90% to 97.5% by mass,
   wherein due to the heating, the low melting point solder is aggregated on and infiltrated into the electrode, a boundary of the low melting point solder is irregular in the electrode, and the thermosetting resin seeps into a portion on the substrate except for the electrode, and wherein the thermosetting resin is filled between a lower part of the component and the substrate so that the lower part of the component and an upper surface of the substrate are adhered to each other, and a periphery of the component is covered by the thermosetting resin to increase bonding strength.

8. The method of manufacturing a bonding structure of a substrate and a component according to claim 7, wherein heating temperature is adjusted to a temperature higher than the melting point of the low melting point solder and the curing temperature of the thermosetting resin.

9. The method of manufacturing a bonding structure of a substrate and a component according to claim 7, wherein heating temperature is gradually raised, the thermosetting resin is completely separated from the low melting point solder aggregated on the electrode and runs from above the electrode to around and under the component.

\* \* \* \* \*